United States Patent
Brennan et al.

(10) Patent No.: US 6,236,731 B1
(45) Date of Patent: May 22, 2001

(54) FILTERBANK STRUCTURE AND METHOD FOR FILTERING AND SEPARATING AN INFORMATION SIGNAL INTO DIFFERENT BANDS, PARTICULARLY FOR AUDIO SIGNAL IN HEARING AIDS

(75) Inventors: Robert Brennan, Kitchener; Anthony Todd Schneider, Waterloo, both of (CA)

(73) Assignee: dspfactory Ltd., Waterloo (CA)

(*) Notice: Subject to any disclaimer, the term of this patent is extended or adjusted under 35 U.S.C. 154(b) by 0 days.

(21) Appl. No.: 09/060,823

(22) Filed: Apr. 16, 1998

Related U.S. Application Data
(60) Provisional application No. 60/041,977, filed on Apr. 16, 1997.

(51) Int. Cl.[7] .................................................. H04R 25/00
(52) U.S. Cl. ........................... 381/316; 381/74; 381/312; 381/314
(58) Field of Search ............................. 381/23.1, 60, 74, 381/312, 313, 314, 316, 317, 320, 321, 323

(56) References Cited

U.S. PATENT DOCUMENTS

| | | | |
|---|---|---|---|
| 4,187,413 | 2/1980 | Moser | 179/107 |
| 4,471,171 | 9/1984 | Köpke et al. | 179/107 |
| 4,508,940 | 4/1985 | Steeger | 179/107 |
| 4,852,175 | 7/1989 | Kates | 381/68.4 |
| 4,868,880 | 9/1989 | Bennett, Jr. | 381/68.2 |
| 4,882,762 | 11/1989 | Waldhauer | 381/106 |
| 4,989,251 | 1/1991 | Mangold | 381/68.2 |
| 5,029,217 | 7/1991 | Chabries et al. | 381/68.2 |
| 5,111,419 | 5/1992 | Morley, Jr. et al. | 364/724.19 |
| 5,276,739 | 1/1994 | Krokstad et al. | 381/68.2 |
| 5,278,912 | 1/1994 | Waldhauer | 381/68.4 |
| 5,515,443 | 5/1996 | Meyer | 381/69 |
| 5,608,803 | 3/1997 | Magotra et al. | 381/68.2 |
| 5,613,008 | * 3/1997 | Martin | 381/68.2 |
| 5,649,019 | * 7/1997 | Thomasson | 381/83 |

FOREIGN PATENT DOCUMENTS

| | | |
|---|---|---|
| 462 885 | 9/1990 | (SE) . |
| WO 95/02212 | 6/1983 | (WO) . |
| WO 95/08248 | 3/1995 | (WO) . |
| WO 97/14266 | 4/1997 | (WO) . |

OTHER PUBLICATIONS

T. Lunner et al.: A Digital Filterbank Hearing Aid Design, Implementation and Evaluation, Spectral Estimation Audio and Electroacoustics, vol. 5, No. Conf. 16, May 14, 1991, pp. 3661–3664, IEEE.

Ju–Hong et al.: Filter Design for Polyphase Filter Banks with Arbitrary Number of Subband Channels, Proceedings of the International Symposium of Circuits and Systems, vol. 3, No. Symp. 22, May 8, 1989, pp. 1720–1723. IEEE.

* cited by examiner

*Primary Examiner*—Curtis Kuntz
*Assistant Examiner*—Suhan Ni
(74) *Attorney, Agent, or Firm*—Bereskin & Parr

(57) ABSTRACT

A filterbank structure is provided which provides a flexible compromise between the conflicting goals of processing delay, filter sharpness, memory usage and band interaction. The filterbank has an adjustable number of bands and a stacking which provides for a selectable shift of band frequencies to one of two discrete sets of center frequencies. The width of the bands and hence the number of the bands is selected depending upon acceptable delay, memory usage, and processing speed required. The flexibility in terms of stacking of the bands provides twice the number of potential band edge placements, which is advantageous for hearing loss fitting, especially at low frequencies. The same filter coefficients can be used for analysis and synthesis, to reduce memory usage.

52 Claims, 6 Drawing Sheets

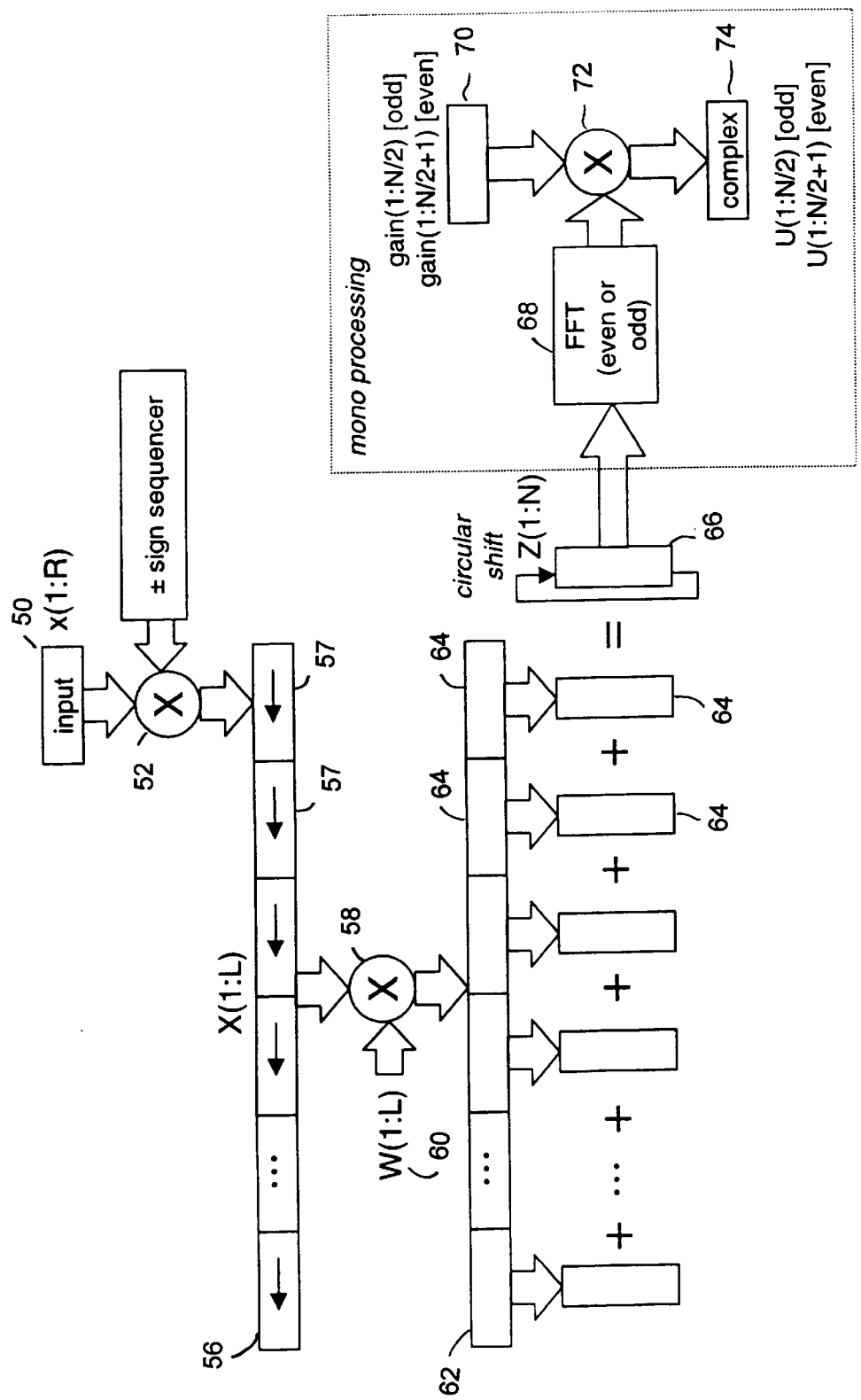
Figure 3: Weighted overlap-add filterbank - *analysis*

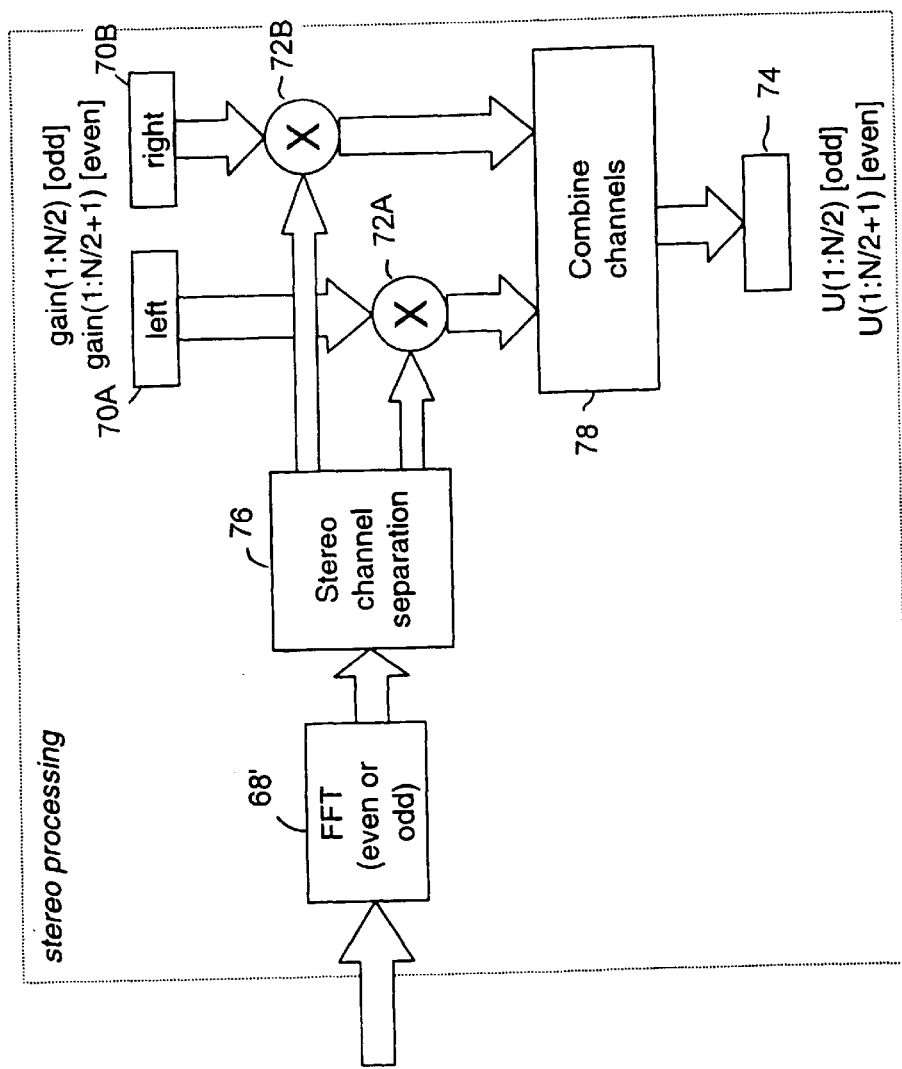
Figure 3a : *FFT processing for stereo WOLA analysis*

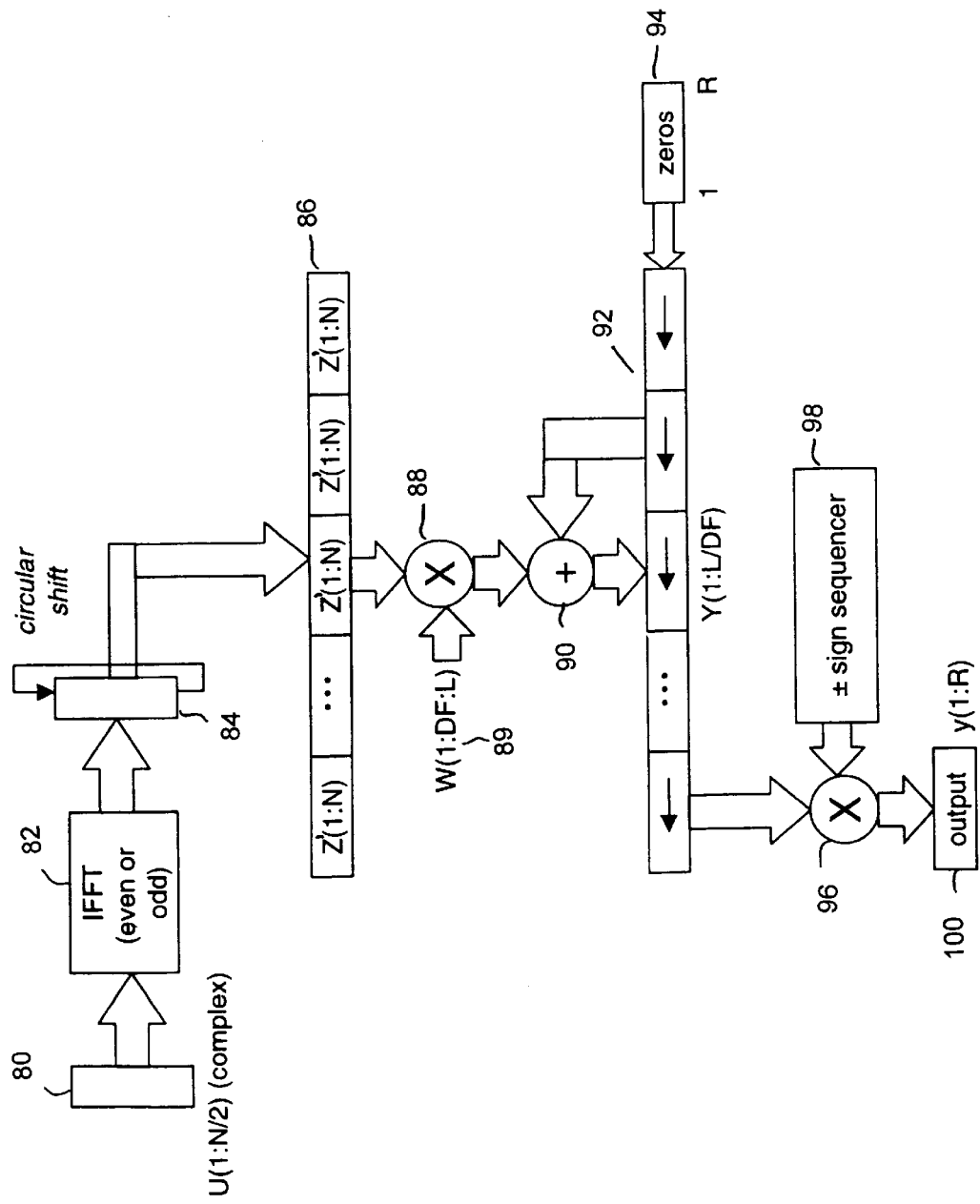
Figure 4 : Weighted overlap-add filterbank - synthesis

FILTERBANK STRUCTURE AND METHOD FOR FILTERING AND SEPARATING AN INFORMATION SIGNAL INTO DIFFERENT BANDS, PARTICULARLY FOR AUDIO SIGNAL IN HEARING AIDS

CROSS-REFERENCE TO RELATED APPLICATION

This application claims benefit from U.S. provisional application serial No. 60/041,977 filed on Apr. 16, 1997.

FIELD OF THE INVENTION

This invention relates to a filterbank structure and a method for filtering and separating an information signal into different bands, particularly for such filtering and separation of audio signals in hearing aids. This invention more particularly relates to such a technique carried out using digital signal processing in hearing aids. This invention more particularly relates to a method and architecture for a digital filterbank for hearing aid applications.

BACKGROUND OF THE INVENTION

Hearing loss is generally associated with a loss of hearing sensitivity which is a function of frequency. The most common type of sensitivity loss is an increasing function of frequency. Sensitivity is typically a function of speech level as well. Hence, loud sounds should be amplified less than soft sounds. It has been long known that a hearing aid should treat the various frequency components of speech differently to render them intelligible to a hearing impaired person.

Known analog hearing aids use relatively simple methods to alter their frequency shaping and dynamic range compression to mitigate the loss in hearing sensitivity for frequency and level.

SUMMARY OF THE INVENTION

Digital techniques promise far greater possibilities for signal processing to aid the hearing impaired. The present inventors have combined processing. This allows great processing flexibility as the bands can be treated independently to compensate more precisely for hearing loss.

In accordance with the first aspect of the present invention, there is provided an oversampled filterbank for filtering an information signal, the filterbank having a filterbank structure comprising a filter means defining a filter bandwidth, said filter means filtering said information signal and separating said information signal into a plurality of frequency band signals each representing one of a plurality of uniformly spaced frequency bands within said filter bandwidth, said frequency bands being stacked in one of an even and an odd manner and said frequency bands overlapping, such that the summation of the unmodified frequency band responses of the plurality of said frequency bands sums to a function within a predetermined passband ripple over said filter bandwidth, wherein the filter means includes a selection input enabling at least one of the following to be selected:

(i) the number of frequency band signals,
(ii) the bandwidth of said frequency bands,
(iii) selection of stacking of said frequency bands in one of an even and an odd manner,
(iv) the degree of overlap between said frequency bands,
(v) an oversampling factor by which said frequency band signals are sampled above the theoretical minimum of critical sampling.

It is to be appreciated that while it is envisaged that the number of frequency bands and their bandwidth will usually be parameters that can be adjustable by the selection input, this is not always the case. More generally, the filterbank can be configured to enable one or more of usual parameters of a digital filterbank to be adjustable, and these can include: the number of bands; the width of each band; whether the bands have abutting band edges, overlap or are spaced apart; coefficients for both analysis and synthesis windows; whether there is any relationship between the analysis and synthesis windows; even or a odd stacking of bands; and the degree of oversampling above the critical sampling rate. Details of these parameters are set our below.

Preferably, the selection input enables at least one of the number of frequency bands and selection of stacking of said frequency bands in one of an even and an oddmanner to be selected, said number of frequency bands being equal to N, and the filter means comprises: (a) a first analysis filterbank means for separating said signal into the plurality of N separate frequency band signals; (b) processing means for receiving and processing each of said separate frequency band signals to provide N separate processed frequency band signals; and (c) a second synthesis filterbank means for receiving and recombining the N separate processed frequency band signals into a single output signal, wherein both of the first analysis filterbank means and the second synthesis filterbank means are connected to the selection input, the processing means being coupled between the first analysis filterbank means and the second synthesis filterbank means.

In another aspect of the present invention, the filterbank comprises a dedicated application specific integrated circuit (ASIC), said ASIC including the first analysis and the second synthesis filterbanks, and a programmable digital signal processor for controlling the number of frequency bands and the bandwidth of each frequency band, said digital signal processor being provided with the selection input.

The filterbank may be adapted to receive a single real monaural information signal, wherein said transform means generates non-negative frequency band signals and negative frequency band signals, said negative frequency band signals being derivable from the non-negative frequency band signals, and said processing means processes only said non-negative frequency band signals. Alternatively is adapted to filter an audio signal comprising first and second real monaural information signals which are combined into a complex stereo signal and wherein said transform means generates N combined frequency band signals, and wherein said processing means includes: (a) channel separation means for separating the N combined frequency band signals into the N frequency band signals corresponding to said first information signal and the N frequency band signals corresponding to said second information signal, each of said N frequency band signals comprising non-negative and negative frequency band signals; (b) first independent channel processing means connected to the channel separation means for receiving and processing each of said separate frequency band signals of said first information signal to provide a first set of N separate processed frequency band signals; (c) second independent channel processing means connected to channel separation means for receiving and processing each of said separate frequency band signals of said second information signal to provide a second set of N separate processed frequency band signals; and (d) channel combination means connected to the first and second independent channel processing means for combining said first set of N processed separate frequency band signals and said second set of N processed separate frequency band signals.

In accordance with another aspect of the present invention, there is provided a method of processing an information signal to selectively modify different frequency bands, the method comprising the steps of: (1) defining a filter frequency bandwidth to be analyzed; (2) dividing the filter frequency bandwidth into a plurality of uniformly spaced bands, said frequency bands being stacked in an even or odd manner and said frequency bands abutting, overlapping, or being spaced apart from one another; (3) filtering the information signal to separate the signal into a plurality of frequency band signals, each representing one of said uniform filter bands; (4) processing the frequency band signals; (5) recombining the signals of the individual bands to form an output signal; and (6) providing an input for enabling at least one of the following to be selected: (i) the number of frequency band signals, (ii) the bandwidth of said frequency bands, (iii) whether said frequency bands are stacked in an even or odd manner, (iv) whether said frequency bands abut, overlap, or are spaced apart from one another, and (v) a decimation factor by which said frequency band signals are downsampled.

In another aspect the method includes transforming the information signal into the frequency domain, providing N separate frequency band signals in the frequency domain, and effecting an inverse transform of the N separate processed frequency band signals into the output signal in the time domain.

The signal, in one variant of the invention, is filtered to give a plurality of evenly stacked bands, as described in Crochiere, R. E. and Rabiner, L. R., *Multirate Digital Signal Processing*, (Prentice-Hall, 1988) which is incorporated herein by reference. Alternatively, it can be filtered to give a plurality of oddly stacked bands. This has the advantage that the placement of the band edges is selectable and this technique gives twice the number of potential band edges. The band edges can be selected depending on the characteristics of a person's hearing loss. In further variants of the invention, other parameters of a digital filterbank are made adjustable either alone or in combination.

DESCRIPTION OF THE DRAWING FIGURES

For a better understanding of the present invention and to show more clearly how it may be carried into effect, reference will now be made, by way of example, to the accompanying drawings, which show a preferred embodiment of the present invention, and in which:

FIGS. 3 and 3a show details of the filterbank analysis structure for monaural and stereo processing, FIG. 4 shows details of the filterbank synthesis structure.

DESCRIPTION OF THE PREFERRED EMBODIMENT

Figure 1:
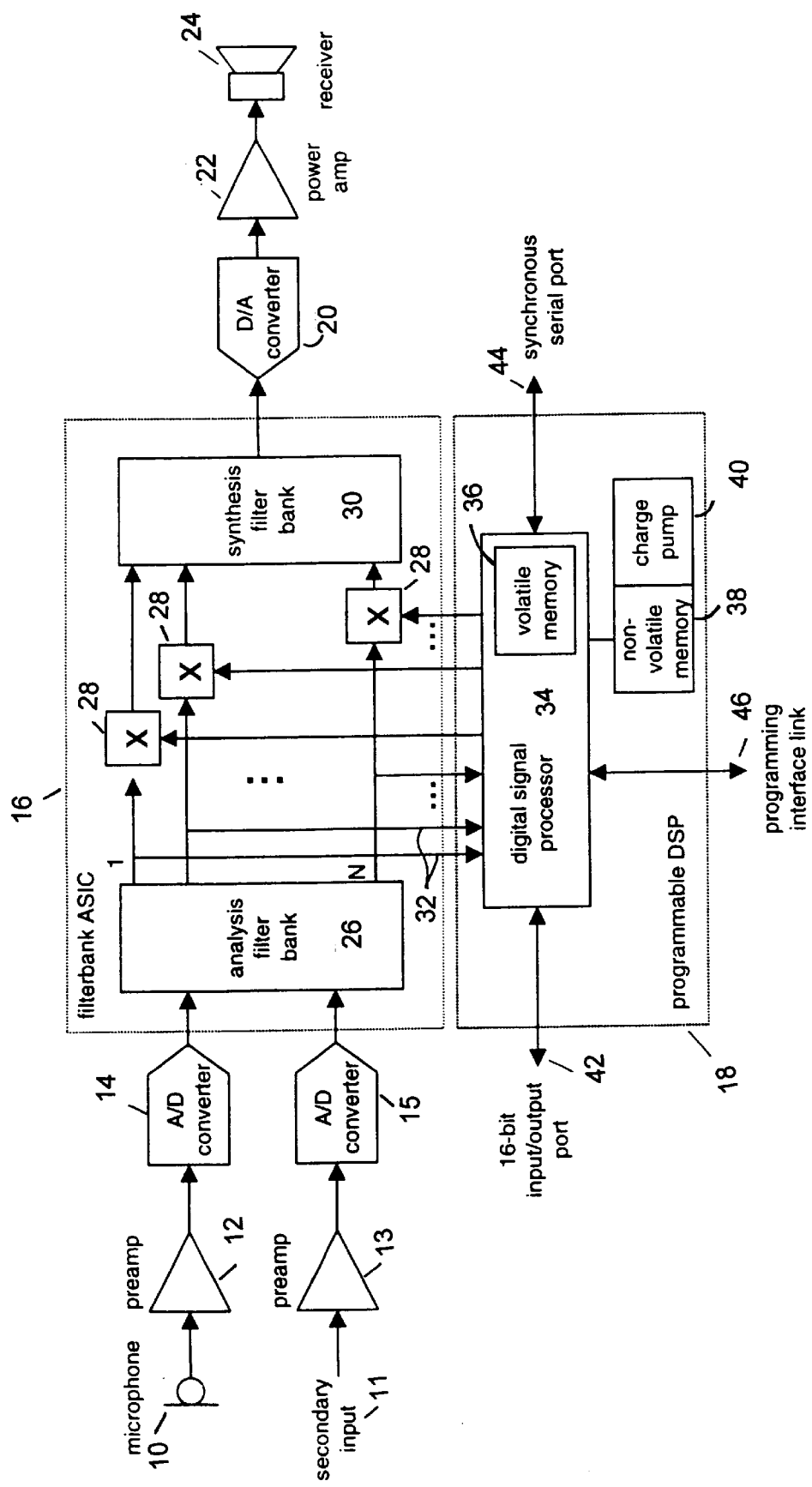
FIG. 1 shows schematically a block diagram of an ASIC data path processor and a programmable DSP unit in accordance with the present invention.

With reference to the drawings, the apparatus of the present invention has a microphone 10, as a first input, connected to a preamplifier 12, which in turn is connected to an analog-to-digital (A/D) converter 14. In known manner this enables an acoustic, audio-band signal, for example, to be received in the microphone, preamplified and converted to a digital representation in the A/D converter 14. A secondary input 11 (which may also comprise a microphone) may also be connected to a preamplifier 13 which is in turn connected to an analog-to-digital (A/D) converter 15. While FIG. 1 shows an audio input signal or signals, the present invention is not limited to use with such signals and can have other information signals, such as a seismological signal, as an input. In the present invention, the term monaural describes embodiments which process one digital stream and the term stereo describes embodiments which process two digital streams. Theoretically, according to the Nyquist Sampling Theorem, provided a signal is sampled at a rate of at least twice the input signal bandwidth, there will be adequate information content to reconstruct the signal. This minimum sampling rate required for reconstruction is commonly referred to as the Nyquist rate.

The output of the A/D converter 14 (and where a secondary input exists, the output of A/D converter 15) is connected to a filterbank application specific integrated circuit (ASIC) 16 as shown in FIG. 1 or, alternatively, directly to a programable DSP unit 18 via a synchronous serial port. Additional A/D converters (not shown) may be provided to permit digital processing of multiple separate input signals. Further input signals may be mixed together in the analog domain prior to digitization by these A/D converters. Mixing may also be done in the digital domain using the programmable DSP prior to processing by a monaural filterbank. The output of the filterbank ASIC 16 is connected to a digital-to-analog (D/A) converter 20. The converter 20 is in turn connected through a power amplifier 22 to a hearing aid receiver 24. Thus, the filtered signal, in known manner, is converted back to an analog signal, amplified and applied to the receiver 24.

The output of the A/D converter 14, and any additional A/D converter that is provided, may, instead of being connected to the ASIC 16 as shown, be connected to the programmable DSP 18 via a synchronous serial port. Similarly, the output D/A converter 20 can alternatively be connected to the programmable DSP 18.

Within the filterbank ASIC 16, there is an analysis filterbank 26, that splits or divides the digital representation of the input signal or signals into a plurality of separate complex bands 1-N. As shown in FIG. 1, each of these bands is multiplied by a desired gain in a respective multiplier 28. In the case of monaural processing, the negative frequency bands are complex conjugate versions of the positive frequency bands. As a result, the negative frequency bands are implicitly known and need not be processed. The outputs of the multipliers 28 are then connected to inputs of a synthesis filterbank 30 in which these outputs are recombined to form a complete digital representation of the signal.

For stereo processing, the complex conjugate symmetry property does not hold. In this case, the N band outputs are unique and represent the frequency content of two real signals. As indicated below and shown in FIG. 3a, the band outputs must first be processed to separate the content of the two signals from each other into two frequency domain signals before the gain multiplication step is performed. The two frequency separated signals are complex conjugate symmetric and obey the same redundancy properties as described previously for monaural processing. Multiplier resource 28 must, therefore, perform two sets of gain multiplications for the non-redundant (i.e. positive frequency) portion of each signal. After multiplication, the signals are combined into a monaural signal, and further processing is identical to the monaural case.

In known manner, to reduce the data and processing requirements, the band outputs from the analysis filterbank 26 are down-sampled or decimated. Theoretically, it is possible to preserve the signal information content with a decimation factor as high as N, corresponding to critical sampling at the Nyquist rate. This stems from the fact that the bandwidth of the N individual band outputs from the analysis filterbank 26 is reduced by N times relative to the input signal. However, it was found that maximum decimation, although easing computational requirements, created severe aliasing distortion if adjacent band gains differ greatly. Since this distortion unacceptably corrupts the input signal, a lesser amount of decimation was used. In a preferred embodiment, the band outputs are oversampled by a factor OS times the theoretical minimum sampling rate. The factor OS represents a compromise or trade-off, with larger values providing less distortion at the expense of greater computation (and hence power consumption). Preferably, the factor OS is made a programmable parameter by the DSP.

To reduce computation, a time folding structure is used as is shown in the transform-based filter bank of FIG. 3, and described in greater detail below. After applying a window function, which is also referred to as a prototype low pass filter, to the incoming signal, the resulting signal is broken into segments, stacked and added together into a new signal. This signal is real for monaural applications and complex for stereo applications. The output of the analysis filterbank is the (even or odd) discrete Fourier transform (DFT) of this segment signal (the DFT is normally implemented with a fast Fourier transform algorithm). For stereo applications a complex DFT must be used, whereas for monaural applications a real input DFT may be used for increased efficiency. As will be known to those skilled in art, the odd DFT is an extension of the even or regular DFT as described in Bellanger, M., *Digital Processing of Signals*, (John Wiley and Sons, 1984), which is incorporated herein by reference. Thus in the preferred embodiment, the present invention comprises a transform-based filterbank in which the action of the DFT is as a modulator or replicator of the frequency response of the prototype low pass filter (i.e. the window function), so that the discrete Fourier transform of the windowed time domain signal or signals results in a series of uniformly spaced frequency bands which are output from the analysis filterbank. The time-folding structure of the present invention further allows the number of frequency bands and their width to be programmable. In doing so, this time-folding structure reduces the size of the DFT from the window size to the segment size and reduces complexity when the desired number of filter bands is less than the window size. This technique is shown generally for a filterbank of window size L and DFT size N in FIG. 3. In total there are N full frequency bands including both non-negative and negative frequency bands, represented by N frequency band signals. For monaural applications these bands (i.e. the band signals) may be processed directly. In stereo applications, the frequency content of the two input signal streams are first separated as shown in FIG. 3a. As previously indicated, in the monaural case, the negative frequency bands are redundant because they can be exactly derived from the positive frequency bands (since they are complex conjugate versions of each other). As will be obvious to one skilled in the art, the positive frequency bands, i.e. the positive frequency band signals, could alternatively be derivable from the non-positive frequency bands, i.e. the non-positive frequency band signals. Effectively, therefore, there are N/2 non-negative complex frequency bands of normalized width $2\pi/N$ for odd stacking; and there are N/2-1 non-negative complex frequency bands of width $2\pi/N$ and 2 non-negative real frequency bands of width $\pi/N$ for even stacking. This is illustrated in FIG. 2a for N=8.

Figure 2A:
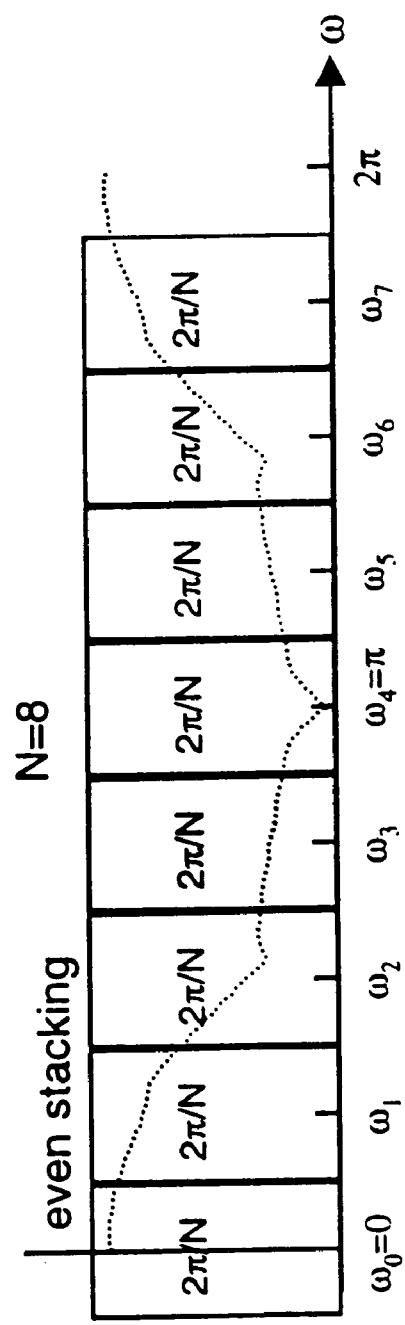
FIGS. 2a and 2b show schematically stacking arrangements for even and odd uniform filterbanks.

As shown in FIG. 2a (the output of each filterbank channel is band limited to $2\pi/N$ and each band output can be decimated by the factor R (i.e. its sampling rate is reduced by keeping only every Rth sample) without, theoretically, any loss of fidelity if $R \leq N$. As mentioned earlier, it is not possible to maximally decimate this filterbank (i.e. to have the input sample shift R equal the DFT size N) and obtain useful results when extensive manipulation of the frequency content is required as in hearing aids. Accordingly, the decimation factor, which is N for critical sampling, is less by a factor of OS. This is accomplished by shifting the input samples by R=N/OS rather than by N. This is advantageous in reducing the group delay since the processing latency (i.e. the delay created by the FIFO) shifting) is smaller by the factor OS. The increase in the band sampling rate eases the aliasing requirements on the analysis filter. Additionally, spectral images are pushed further apart reducing the image rejection requirements on the synthesis filter. Lowering the requirements of these filters further reduces delay (since these filters can be simpler, i.e. of lower order). While maximum oversampling, i.e. OS=N, provides for optimal reconstruction of the input signal or signals, this results generally in unacceptable computational expense.

With reference to FIG. 3, the overlap-add analysis filterbank 26 includes an input 50 for R samples. In known manner, the exact size or word length of each sample will depend upon the accuracy required, whether it is fixed-point or floating-point implementation etc. The input 50 is connected to a multiplication unit 52 which also has an input connected to a circular ± sign sequencer input 54 having a length of 2*OS samples. This circular sequencer input 54, which may be generated by a shift register, has a series of inputs for odd stacking of the filter bands and inputs for even stacking of the filter bands.

In the multiplication unit 52, for the even filterbank structure, each block of R input samples is multiplied by +1, so as to remain unchanged. For the even DFT, which has basis functions ending in the same sign (i.e. which are continuous), no modulation is required to obtain continuous basis functions.

For the odd filterbank structure, the first OS blocks of R input samples are multiplied by +1 and the next OS blocks by −1, the next OS blocks by +1, etc. Since the odd DFT has basis functions ending in opposite signs (i.e. which are not continuous), this modulation serves to produce continuous basis functions.

The output of the multiplication unit 52 is connected to a first buffer 56 holding L samples, indicated as X(1:L). These samples are split up into individual segments 57, each of which contain R samples. The buffer 56 is sized so that the L samples form a desired window length. The larger the window length L, the more selective each channel becomes at the expense of additional delay. The buffer 56 is connected to a second multiplication unit 58, together with a window function 60, indicated as W(1:L). The modulation property of the fast Fourier transform procedure creates a complete uniformly spaced filterbank by replicating the frequency response of the window function (also referred to as the prototype low-pass filter) at equally spaced frequency intervals. It is necessary to properly design this window function to give a desired passband and stopband response to the filter bands and thereby reduce audible aliasing distortion.

The window function (which is a prototype low pass filter) ideally satisfies the requirements for a good M-band filter, i.e. a good low pass filter which has zeros at every interval of N samples. Other window functions can also be used. See Vaidyanathan, P. P., "Multirate Digital Filters, Filter Banks, Polyphase Networks, and Applications: A Tutorial", Proc. IEEE, Vol. 78, No. 1, pp. 56–93 (January 1990), which is incorporated herein by this reference. As will be appreciated by those skilled in the art, this filter may be designed as a windowed sinc function or by using Eigenfilters (see Vaidyanathan, P. P., and Nguyen, T. Q., "Eigenfilters: A New approach to least-squares FIR filter design and applications including Nyquist filters", *IEEE Trans. on Circuits and Systems*, Vol. 40, No, 4 (December 1994), pp. 11–23). The coefficients of the window function are generated by the programmable DSP or generated and stored in non-volatile memory. A general window is typically stored in non-volatile memory, however for the parametric classes of windows based on the sinc function, the window function need not be stored as it may be calculated on system initialization using only a few parameters.

The output of the second multiplication unit 58 is connected to a second output buffer 62. This output buffer 62 again has the same L samples, arranged into segments 64. Here, the segments contain N samples. In a typical embodiment, N might equal 32 and the number of channels is 16 (for an odd DFT/odd stacking) or 17 (for an even DFT/even stacking—because of the two half bands). For adequate selectivity with band aliasing reduction greater than 55 dB, a window length L of 256 sampling can be used (the window length L is constrained to be a multiple of N, and in preferred embodiments is also a multiple of $2^N$ for computational simplicity) and the over-sampling factor, OS, should be 2 or greater. For example, letting OS equal 2 results in R equal to 16 (i.e. N/OS). As mentioned earlier, for monaural applications, the samples are real, and for stereo applications the samples are complex.

The segments are separated, and as indicated below the buffer 62, individual segments 64 are added to one another to effect the time folding or time aliasing operation, and thereby reduce the number of necessary computations in processing the input signal or signals. The details of the time folding step are described in Crochiere, R. E. and Rabiner, L. R., *Multirate Digital Signal Processing, supra*. Ideally, the time folding step does not result in any loss of information, and in practical implementations any resulting loss can be made insignificant. The addition is performed, and the result is supplied to circular shift sequencer 66, which is preferably a circular shift register, as shown in FIG. 3. This shift register 66 holds N samples and shifts the samples by R samples (where R=N/OS) at a time.

The time aliased stacked and summed total is then subject to an odd FFT, or even FFT as required, by the FFT unit 68 (as shown in FIG. 3 for monaural applications) or the FFT unit 68' (as shown in FIG. 3a for stereo applications) to produce the DFT. The DFT provided by 68 is an N-point transform with real inputs (monaural), and the DFT provided by 68' is an N-point transform with complex inputs (stereo). For monaural applications, the non-negative frequency components of the DFT output by the FFT unit 68, and a set of gain values G(1:N/2) for odd stacking (or G(1:N/2+1) for even stacking) from a multiplier resource unit 70, are connected to a multiplication unit 72. This gives an output 74 of U(1:N/2) for odd stacking (or U(1:N/2+1) for even stacking) which is complex, i.e. with a magnitude and phase, in known manner.

As illustrated in FIG. 3a, for stereo applications the two channels must first, i.e. before the multiplication step, be separated in a stereo channel separation step indicated at 76. To illustrate, consider the case of two real time domain signals x1 and x2 which have been combined into a single complex signal x1+jx2, where x1 and x2 are sample vectors which are N frequency domain samples long. Since the filterbank operation is linear, the resulting output from the analysis filterbank is X1+jX2, where X1 and X2 are also N samples long. The frequency information of the two channels X1 and X2 are separable by using the symmetry relationships present in the N band outputs (i.e. the first channel spectrum has a symmetric real portion and an anti-symmetric imaginary portion, whereas the second channel has an anti-symmetric real portion and a symmetric imaginary portion). As a result, well known operations are all that are necessary to separate the two channels: see B. P. Flannery, S. A. Teukolsky, W. T. Vetterling, *Numerical Recipes in C*, (Cambridge University Press: 1991) Chapter 12.

After separation, the non-negative frequency components of these data streams are each multiplied by a separate set of gain values from multiplier resources 70A and 70B respectively (multiplier resources 70A and 70B typically represent the separate processing of the left and right channels, and each contains N/2 values for odd stacking or N/2+1 values for even stacking). After the multiplication steps at 72A and 72B, the two channels are combined in a combine channels step indicated at 78, which provides an output 74 as in the monaural case. The combination step 78 is simply the point by point summation of the two frequency domain streams.

As compared to FIG. 1, the multiplication units 72 of FIG. 3 and 72A and 72B of FIG. 3a are equivalent to the multiplication units 28 shown in FIG. 1.

Reference will now be made to FIG. 4, which shows the corresponding synthesis filterbank. Here, the input is shown at 80 of the complex representation of the signal in the frequency domain, U(1:N/2) for odd stacking (or U(1:N/2+1) for even stacking). This is converted to the time domain by an inverse DFT, which again is odd or even as required and which is implemented by the inverse PFT (IFFT) algorithm unit 82. In known manner, the IFFT unit 82 produces a real output.

Corresponding to the circular shift sequence 66, an input circular shift sequencer 84, which can comprise a shift register, holds N samples and circularly shifts the samples in steps that are decreasing multiples of R samples (where R=N/OS) at a time. This shift undoes the shift performed by 66.

The N-sample output of the circular shift sequence 84, Z'(1:N), is replicated and concatenated as necessary to form an $^L/_{DF}$ sample sequence in input buffer 86, where DF represents the synthesis window decimation factor (and is not to be confused with the analysis filterbank time domain decimation factor R). As discussed below, the parameter DF is less than or equal to OS when the synthesis window function is based on a decimated version of the analysis function; otherwise DF equals 1. This replication and concatenation step is the inverse operation of the time aliasing step previously described. As illustrated in FIG. 4, this input buffer is shown as $^L/_{DF*N}$ N-sample segments which have been periodically extended from the circular shift sequence 84. It is possible for $^L/_{DF*N}$ to be, a non-integer fraction. For large synthesis window decimation factors, DF, $^L/_{DF*N}$ may also be less than 1, and in such cases the input buffer 86 becomes shorter than N samples and comprises only the central portion of Z'(1:N), The output of the buffer 86 is connected to a multiplication unit 88. The multiplication unit 88 has another input for a synthesis window 89 indicated as W(1:DF:L). The window 89 which is L/DF samples long removes unwanted spectral images. The analysis window has a cutoff frequency of π/N and the synthesis window has a cutoff frequency of π/R= OS.π/N . The latter may be based on the decimated analysis window by setting DF±OS if the "droop" (or attenuation) of the analysis filter at its cutoff frequency divided by DF, i.e. at π/N.DF, is not significant since this represents the attenuation of the synthesis window at π/N. In such a case, the synthesis window function is generated by decimating the analysis window coefficients by a factor of DF±OS. This constraint (i.e. having the synthesis window based on the analysis window) is preferable for memory limited applications and may be removed, advantageously, if sufficient memory is available. As indicated previously, I, corresponds to the number of samples held in the buffer 56 in the analysis filterbank (FIG. 3), and DF represents the synthesis window decimation factor, where for DF equal to 2 every other sample is deleted. Similarly to the analysis window function, the synthesis window function W(1:DF:L) (this notation indicates a vector derived from a vector W by starting at index 1 and selecting every DF'th sample not exceeding index L) is ideally a good M-band filter, i.e. a good low pass filter which has zeros at every interval of N/DF samples. However, as with the analysis window, other window functions can also be used. The output of the multiplication unit 88 is connected to a summation unit 90. The summation unit 90 has an output unit connected to an output buffer 92. The buffer 92 has an input at one end for additional samples and an additional sample input 94, so that the output buffer 92 acts like a shift register that shifts R samples each time a new input block is received.

The output of the summation unit 90 is supplied to the buffer 92. As indicated by the arrows, the contents of the buffer 92 are periodically shifted to the left by R samples. This is achieved by adding R zeros to the right hand end of the buffer 92, as viewed. Following this shift, the contents of the buffer 92 are added to the product of W(1:DF:L) and the periodically extended buffer 86, The result is stored in the buffer 92 which holds $L/_{DF}$ samples (or equivalently $L/_{DF*N}$ N-sample segments). As previously explained, the buffer 92 may be less than one N-sample in length for large synthesis window decimation factors, DF.

It must be appreciated that, the output from the buffer 92, at the left hand end, is a signal which in effect has been added $L/_{(DF*R)}$ times, so as to comprise portions of signals added together.

Because the coefficients of the window function W(1:L), the length of the window L, and the synthesis window decimation factor DF are all programmable parameters (by way of DSP unit 18), the present invention allows for a selectable number of channels, and a selectable range of bandwidths. As an additional advantage, the selectable even/odd stacking feature permits the bands to be shifted in unison by half of the channel bandwidth, without increasing delay. Thus the present invention allows the number of channels or bands and the width of those bands to be selected.

R samples at a time are taken from the buffer 92 and sent to a multiplication unit 96. Mirroring the circular ± sign sequencer input 54, there is another circular ± sign sequencer input 98, which again has a series of multiplication factors of +1 or −1, depending upon whether an odd or even DFT is executed. This step exactly undoes the modulation step performed in the analysis stage.

After multiplication in the unit 96 by the appropriate factors, R samples are present at the output 100, as indicated as Y(1:R). These samples are fed to the D/A converter 20.

The resynthesis procedure in addition to generating the correct signal in each band, produces unwanted spectral images which, when over-sampled by OS, are spaced OS times farther apart than for critical sampling, The synthesis window performed the function of removing these images similar to the function of the analysis window in preventing aliasing. Since these window function are related, when memory is scarce, it is preferable to use a synthesis window related to the analysis window in order to conserve memory. In general, the reconstruction window call conveniently be the synthesis window decimated by DF, the synthesis window decimation factor.

As indicated at 32, connections to a programmable DSP 18 are provided, to enable the DSP to implement a particular processing strategy. The programmable DSP 18 comprises a processor module 34 including a volatile memory 36, The processor 34 is additionally connected to a nonvolatile memory 38 which is provided with a charge pump 40.

As detailed below, various communication ports are provided, namely: a 16 bit input/output port 42, a synchronous serial port 44 and a programming interface link 46.

The frequency band signals received by the DSP 18 represent the frequency content of the different bands and are used by the digital signal processor 34 to determine gain adjustments, so that a desired processing strategy can be implemented. The gains are computed based on the characteristics of the frequency band signals and are then supplied to the multipliers 28. While individual multipliers 28 are shown, in practice, as already indicated these could be replaced by one or more multiplier resources shared amongst the filterbank bands. This can be advantageous, as it reduces the amount of processing required by the DSP, by reducing the gain update rate and by allowing further computations to be done by the more efficient ASIC. In this manner, the memory requirements are also reduced and the DSP unit can remain in sleep mode longer.

The processor 34 can be such as to determine when gain adjustments are required. When gain adjustments are not required, the whole programmable DSP unit 18 can be switched into a low-power or standby mode, so as to reduce power consumption and hence to extend battery life.

In another variant of the invention, not shown, the multipliers 28 are omitted from the ASIC. The outputs from the analysis filterbank 26 would then be supplied to the digital signal processor 34, which would both calculate the gains required and apply them to the signals for the different bands. The thus modified band signals would then be fed back to the ASIC and then to the synthesis filterbank 30. This would be achieved by a shared memory interface, which is described below.

Communication between the ASIC 16 and the programmable DSP 18 is preferably provided by a shared memory interface. The ASIC 16 and the DSP 18 may simultaneously access the shared memory, with the only constraint being that both devices cannot simultaneously write to the same location of memory.

Both the ASIC 16 and programmable DSP 18 require non-volatile memory for storage of filter coefficients, algorithm parameters and programs as indicated at 38. The memory 38 can be either electrically erasable programmable read only memory (EEPROM) or Flash memory that can be read from or written to by the processor 34 as required. Because it is very difficult to achieve reliable operation for large banks (e.g., 8 kbyte) of EEPROM or Flash memory at low supply voltages (1 volt), the charge-pump 40 is provided to increase the non-volatile memory supply voltage whenever it is necessary to read from or write to non-volatile memory. Typically, the non-volatile memory 38 and its associated charge pump 40 will be enabled only when the whole apparatus or hearing aid "boots"; after this it will be disabled (powered down) to reduce power consumption.

Program and parameter information are transmitted to the digital signal processor 34 over the bi-directional programming interface link 46 that connects it to a programming interface. It will thus be appreciated that either the programming interface link 46 or the audio link through the microphone 10 (and optional second microphone for a stereo implementation), for the synthesized audio band signal, provide a selection input enabling the number of frequency bands, the width of each band, even or odd stacking, and other parameters to be selected. This interface receives programs and parameter information from a personal computer or dedicated programmer over a bi-directional wired or wireless link. When connected to a wired programming interface, power for non-volatile memory is supplied by the-interface; this will further increase the lifetime of the hearing aid battery. As detailed in assignee's copending application No. 09/060,820 filed simultaneously herewith, a specially synthesized audio band signal can also be used to program the digital filterbank hearing aid.

The synchronous serial port 44 is provided on the DSP unit 18 so that an additional analog-to-digital converter can be incorporated for processing schemes that require two input channels (e.g., beamforming—beamforming is a technique in the hearing aid art enabling a hearing aid with at least two microphones to focus in on a particular sound source).

The programmable DSP 34 also provides a flexible method for connecting and querying user controls. A 16-bit wide parallel port is provided for the interconnection of user controls such as switches, volume controls (shaft encoder type) and for future expansion. Having these resources under software control of the DSP unit 18 provides flexibility that would not be possible with a hardwired ASIC implementation.

It is essential to ensure the reliability of the digital filterbank hearing aid in difficult operating environments. Thus, error checking or error checking and correction can be used on data stored in non-volatile memory. Whenever it is powered on, the hearing aid will also perform a self-test of volatile memory and check the signal path by applying a digital input signal and verifying that the expected output signal is generated. Finally, a watchdog timer is used to ensure system stability. At a predetermined rate, this timer generates an interrupt that must be serviced or the entire system will be reset. In the event that the system must be reset, the digital filterbank hearing aid produces an audible indication to warn the user.

A number of sub-band coded (i.e., digitally compressed) audio signals can be stored in the non-volatile memory 38 and transferred to volatile memory (RAM) 36 for real-time playback to the hearing aid user. The sub-band coding can be as described in chapters 11 and 12 of Jayant, N. S. and Noll, P., Digital Coding of Waveforms (Prentice-Hall; 1984) which is incorporated herein by this reference. These signals are used to provide an audible indication of hearing aid operation. Sub-band coding of the audio signals reduces the storage (non-volatile memory) that is required and it makes efficient use of the existing synthesis filterbank and programmable DSP because they are used as the sub-band signal decoder, Thus, in accordance with the present invention, the digital processing circuit consists of an analysis filterbank that splits the digital representation of the input time domain signal into a plurality of frequency bands, a means to communicate this information to/from a programmable DSP and a synthesis filterbank that recombines the bands to generate a time domain digital output signal.

Ideally, a digital hearing aid, or indeed any hearing aid, would have non-uniform frequency bands that provide high resolution in frequency only where it is required. This would minimize the number of bands, while enabling modification of the gain or other parameters only where required in the frequency spectrum. However, the most efficient implementation of multi-channel filters, where the implementation is based on known transforms such as the Fourier transform, have uniform spacing. This naturally results from the fact that uniform sampling in time maps to uniform spacing in frequency. Thus, the present invention provides a multi-channel filter design with uniform spacing.

The number of bands, i.e., frequency resolution, required by a digital hearing aid depends upon the application. For frequency response adjustment at low frequencies, a digital hearing aid should be capable of adjustment in 250 Hz frequency steps. This fine adjustment allows the low-frequency gain targets at audiometric frequencies (the standard frequencies at which hearing characteristics are measured) to be accurately set.

The sampling rate used by a digital hearing aid is related to the desired output bandwidth. Since speech typically has little energy above 5 kHz and covering this frequency range results in highly intelligible speech, a sampling rate of 16 kHz, corresponding to a bandwidth of 8 kHz was chosen to allow a margin for safety. At a proportional increase in power consumption, however, a sampling rate of 24 kHz or beyond may prove desirable for higher fidelity. The minimum sampling rate required to achieve a desired output bandwidth should be selected to minimize power consumption. Adequate frequency coverage and resolution is achieved by using sixteen 500 Hz wide bands. This in turn requires a 32-point discrete Fourier transform. Although the bands are 500 Hz wide in this typical embodiment, the band edges may be adjusted in unison by 250 Hz steps. This is accomplished through the use of the DFT with even or odd stacking.

Compressor systems, which attempt to map variations in input signal level to smaller variations in output level, typically employ two or more bands so that high-level sounds in one band do not reduce the gain in other bands and impair speech perception, There is considerable debate on the number of bands that should be provided for an ideal compression system, assuming there is some perfect ideal system. The current consensus seems to be that two bands are better than one, but that more than two bands does not lead to improved speech reception thresholds. However, some results and opinions cast doubts on past results and methodologies that were used to evaluate multichannel compression systems.

For noise reductions systems, however, it is desirable to have a large number of bands so that only those portions of the spectrum that are noise can be attenuated, while not affecting parts of the spectrum without noise. To extract speech from noise, the filters should have small bandwidths to avoid removing speech harmonies. For the 8 kHz bandwidth mentioned, 128 bands provide bandwidths of 62.5 Hz which is adequate to avoid this problem.

There exist many possible tradeoffs between the number of bands, the quality of the bands, filterbank delay and power consumption. In general, increasing the number or quality of the filterbank bands leads to increased delay and power usage. For a fixed delay, the number of bands and quality of bands are inversely related to each other. On one hand, 128 channels would be desirable for flexible frequency adaptation for products that can tolerate a higher delay. The larger number of bands is necessary for the best results with noise reduction and feedback reduction algorithms.

On the other hand, 16 high-quality channels would be more suitable for extreme frequency response manipulation. Although the number of bands is reduced, the interaction between bands can be much lower than in the 128 channel design. This feature is necessary in products designed to fit precipitous hearing losses or other types of hearing losses where the filterbank gains vary over a wide dynamic range with respect to each other. Now, in accordance with the present invention, the filterbanks 26, 30 provide a number of bands, which is a programmable parameter. In accordance with the discussion above, the number of bands is typically in the range of 16–128.

A further increase in low-frequency resolution (i.e. more channels) may be obtained by further processing of one or more analysis filterbank output samples. This processing causes additional system delays since the additional samples must be acquired first before processing. This technique may be acceptable at low frequencies and for certain applications.

For applications requiring low processing delay and high frequencies, the converse of this technique is useful. Initial processing is done on fewer bands lowering the processing delay and increasing the bandwidth of the individual filter bands. Subsequent processing is performed on, typically, lower frequency bands to increase the frequency resolution at the expense of low-frequency delay; i.e. the lower frequency bands are further divided, to give narrower bands and greater resolution.

Commonly, there are two basic types of filterbanks, namely finite impulse response (FIR) and infinite impulse response (IIR). FIR filterbanks are usually preferred, because they exhibit better performance in fixed-point implementations, are easier to design and of constant delay. Frequency bands in a filterbank can be non-overlapping, slightly overlapping or substantially overlapped. For hearing aid applications, slightly overlapped designs are preferred, because they retain all frequency domain information while providing lower interaction between adjacent bands. Ideally, the bands would be designed to abut precisely against each other with no overlap. This however would require very large order filters with unacceptably large delay, so in practice low-order filters (128 to 512 points) are used, which creates slightly overlapped designs.

As discussed previously, uniform spacing of the bands is provided, because they can be implemented using fast frequency-domain transforms, e.g. either a FFT or a discrete cosine transform, which require less computation than time-domain implementations.

Two types of channel stacking arrangements are known for uniform filterbanks, as shown in FIG. 2. For even stacking (FIG. 2a) the n=0 channel is centred at ω=0 and the centres of the bands are at normalized frequencies $\omega_n=2n\pi/N, n=0, 1, \ldots, N-1$.

Figure 2B:
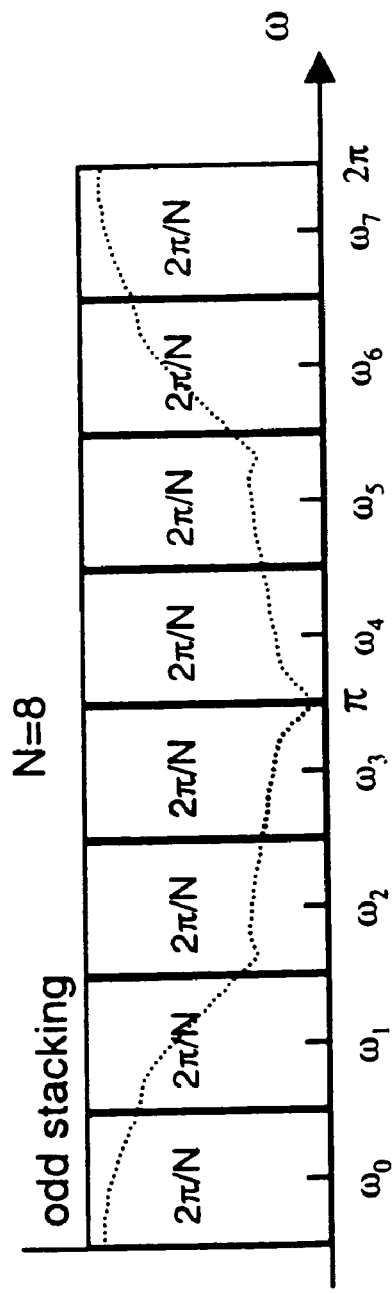

Correspondingly, for an odd stacking arrangement (FIG. 2b), the n=0 channel is centred at a $\omega=\pi/N$ and the band frequencies are at $\omega_n=2n\pi/N+\pi/N, n=0, 1, \ldots, N-1$. These even and odd stacking arrangements are shown in FIG. 2a and 2b respectively. For audio processing applications, odd stacking is generally preferred over even stacking, because it covers the entire input signal bandwidth between DC and the Nyquist frequency equally with no half bands. The frequency band (DC to sampling rate) in FIG. 2a, 2b is shown normalized to cover a span of $2\pi$.

Figure 2C:
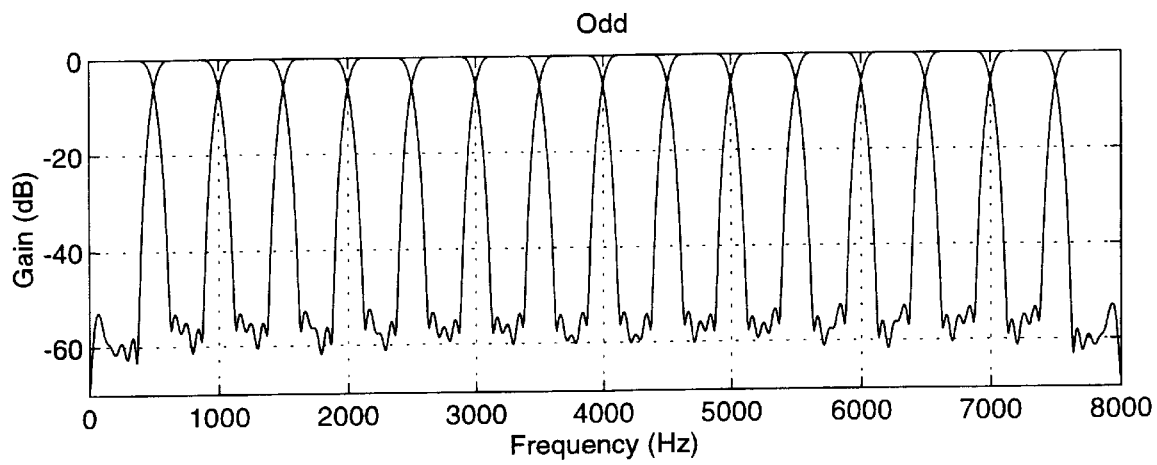
FIGS. 2c and 2d show simulated stacking arrangements for even and odd uniform filterbanks showing typical filter characteristics.
Figure 2D:
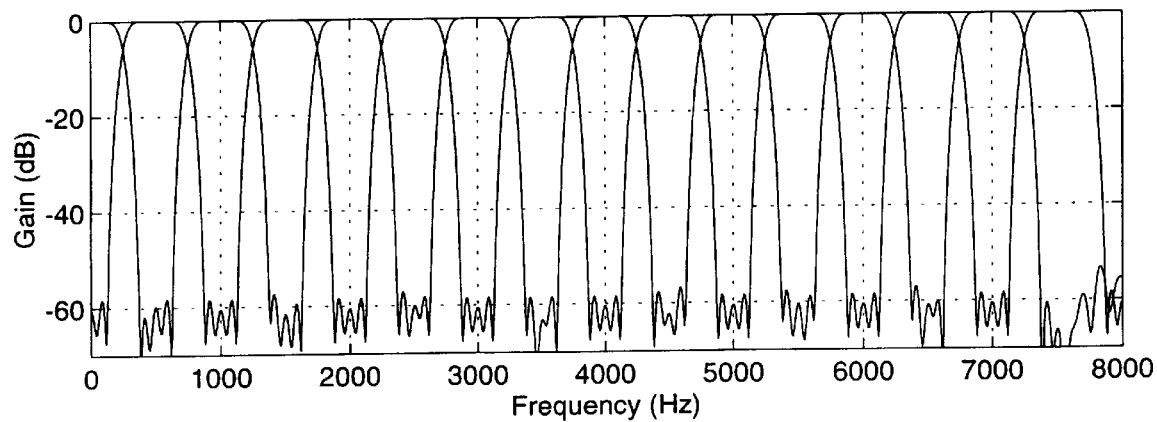

The ability to select either even or odd stacking is a considerable advantage, as it doubles the number of useable band edges. The placement of the band edges is then selectable. The band edges can be selected depending on the characteristics of a person's hearing loss. FIG. 2 shows, as a dashed line, a typical input spectrum for 0 to π (the normalized Nyquist frequency) that is asymmetric about f=π because the signal is sampled at a rate of 2π. FIG. 2c and 2d also show the odd and even stacking arrangements. They also show real or characteristic filter responses to each filter.

While the preferred embodiment of the invention has been described, it will be appreciated that many variations are possible within the scope of the invention.

Some types of hearing loss result in precipitous losses or other types of losses which vary significantly across the frequency spectrum, which in turn requires the filterbank gains to vary over a wide dynamic range with respect to each other. In such a case, it becomes advantageous to provide some other frequency dependent gain in a fixed filter before the input to the analysis filterbank 26. This can provide a co-operative arrangement, in which the fixed or prefilter provides a coarse adjustment of the frequency response. This then leaves the analysis filterbank to provide a fine, dynamic adjustment and the problems of widely varying gains between adjacent filter bands are avoided.

The filterbank structure of the present invention provides a natural structure for the generation of pure tones at the centre frequencies of each filter band. As these tones hit a majority of the audiometric frequencies that are employed to measure hearing loss, the filterbank can be programmed to emit pure tones. With these pure tones, the hearing aid can be used directly, to assess hearing loss, replacing the audiometer currently used and making the test more accurate and realistic.

In addition to, or instead of, the prefilter mentioned above, there may be a further requirement for frequency control within a band, which alternatively could be characterised as splitting a band into a number of sub bands. To provide this filtering flexibility, and to maintain the best signal to noise ratio, and to maintain the simple evenly spaced band structure outlined above, a postfilter can be added after the synthesis filterbank 30.

There can be cases involving the fitting of severe losses requiring significant amounts of high frequency gain. In this situation, if the gain is implemented in the filterbanks, the hearing aid can become acoustically unstable. Here, the postfilter would act as a notch filter, to remove only the narrow band of oscillatory frequencies, while leaving the rest of the filter band alone. Alternatively, this can also be accomplished in the filterbank itself.

We claim:

1. An oversampled filterbank for filtering an information signal, the filterbank having a filterbank structure comprising a filter means defining a filter bandwidth, said filter means filtering said information signal and separating said information signal into a plurality of frequency band signals, each representing one of a plurality of uniformly spaced frequency bands within said filter bandwidth, said frequency bands being stacked in one of an even and an odd manner and said frequency bands overlapping, such that the summation of the unmodified frequency band responses of the plurality of said frequency bands sums to a function within a predetermined passband ripple over said filter bandwidth, wherein the filter means includes a selection input enabling at least one of the following to be selected:
  (i) the number of frequency band signals,
  (ii) the bandwidth of said frequency bands,
  (iii) selection of stacking of said frequency bands in one of an even and an odd manner,
  (iv) the degree of overlap between said frequency bands;
  (v) an oversampling factor by which said frequency band signals are sampled above the theoretical minimum of critical sampling.

2. A filterbank as claimed in claim 1, wherein the selection input enables at least one of the number of frequency bands and whether said frequency bands are stacked in an even or odd manner to be selected, said number of frequency bands being equal to N, and the filter means comprises:
  (a) a first analysis filterbank means for separating said signal into the plurality of N separate frequency band signals;
  (b) processing means for receiving and processing each of said separate frequency band signals to provide N separate processed frequency band signals; and
  (c) a second synthesis filterbank means for receiving and recombining the N separate processed frequency band signals into a single output signal, wherein both of the first analysis filterbank means and the second synthesis filterbank means are connected to the selection input, the processing means being coupled between the first analysis filterbank means and the second synthesis filterbank means.

3. A filterbank as claimed in claim 2, which comprises a dedicated application specific integrated circuit (ASIC), said ASIC including the first analysis and the second synthesis filterbanks, and a programmable digital signal processor for controlling the number of frequency bands and the bandwidth of each frequency band, said digital signal processor being provided with the selection input.

4. A filterbank as claimed in claim 3, wherein said processing means includes a multiplier means for multiplying each of the frequency band signals by an adjustable gain to provide the N separate processed frequency band signals.

5. A filterbank as claimed in claim 4, wherein the multiplier means comprises one or more dedicated multiplier resources incorporated on the application specific integrated circuit.

6. A filterbank as claimed in claim 4, wherein the multiplier means comprises a multiplier resource provided on the programmable digital signal processor.

7. A filterbank as claimed in claim 1, wherein the selection input enables whether said frequency bands are stacked in an even or odd manner to be selected.

8. A filterbank as claimed in claim 1, wherein the selection input enables whether said frequency bands abut, overlap, or are spaced apart from one another to be selected.

9. A filterbank as claimed in claim 1, wherein the selection input enables the decimation factor to be selected.

10. A filterbank as claimed in claim 1, wherein the selection input enables the degree of overlap in the frequency bands to be selected, including selection of abutting and spaced apart frequency bands.

11. A filterbank as claimed in claim 1, which includes a shared memory interface, for interfacing with a programmable digital signal processor.

12. A filterbank as claimed in claim 1, which includes low frequency processing means for additional processing of low-frequency bands to provide additional resolution.

13. A filterbank as claimed in claim 2, which includes a prefiltering means connected to the first analysis filterbank means, for modifying the gain of at least one selected portion of the frequency spectrum of said information signal.

14. A filterbank as claimed in claim 2 or 13, which includes a postfiltering means connected to the second filterbank means, for postfiltering the single output signal.

15. A filterbank as claimed in claim 3, wherein the first analysis filterbank means, the processing means and the second synthesis filterbank means utilize digital signal processing, the first analysis filterbank means being adapted to receive an input digital sample stream and the second synthesis filterbank means providing an output digital data stream as the output signal wherein the filterbank includes an analog-to-digital conversion means connected to said first analysis filterbank for receiving an original analog signal and for converting said analog signal into an input digital sample stream at an initial input sampling rate which forms said information signal for the analysis filterbank, and a digital-to-analog conversion means connected to said second synthesis filterbank for converting the output digital data stream to form an analog version of said single output signal.

16. A filterbank as claimed in claim 15, wherein the first analysis filterbank means comprises:
  (a) a blocking means for receiving the input digital sample stream and blocking a first number, R where $R \leq N$, of the digital samples so as to provide a blocked input digital sample stream, the ratio of N/R corresponding to an oversampling factor;
  (b) an analysis window means for applying an analysis window function to the input digital sample stream to provide a windowed blocked digital sample stream, said analysis window function being defined by a set of analysis window coefficients;
  (c) a time folding means for overlapping and adding blocks of said windowed blocked digital sample stream, each of said blocks comprising N digital samples, to provide a summed block of N digital samples; and
  (d) a discrete transform means for receiving said summed block of N digital samples and transforming the signal into a discrete frequency domain signal having N components, the N components corresponding to the N frequency band signals.

17. A filterbank as claimed in claim 16, wherein the second synthesis filterbank means comprises:
  (a) an inverse discrete transform means for receiving said N processed frequency band signals and for effecting an inverse transform to form a block of N digital samples;
  (b) a replication and concatenation means for replicating and concatenating said processed block of N digital samples to provide a periodically extended block of N digital samples;
  (c) a synthesis window means for applying a synthesis window function to said extended block of N digital samples to provide a windowed periodically extended block of N digital samples, said synthesis window function being defined by a set of synthesis window coefficients; and
  (d) a summation buffer means for receiving said windowed periodically extended block of N digital samples and adding said windowed periodically extended samples to the shifted contents of the buffer each time a new windowed periodically extended sample is received, so as to provide a processed information signal.

18. A filterbank as claimed in claim 17, wherein said synthesis window function is based on a decimated version of said analysis window function.

19. A filterbank as claimed in claim 16, 17, or 18 in which the programmable digital signal processor is operable to vary said analysis window coefficients and said synthesis window coefficients.

20. A filterbank as claimed in claim 16 or 17, in which the programmable digital signal processor is operable to vary said oversampling factor, and in which the oversampling factor is at least equal to 2.

21. A filterbank as claimed in claim 3 in which the programmable digital signal processor is operable to provide either even stacking or odd stacking of the frequency bands within said filter bandwidth.

22. A filterbank as claimed in claim 1, 2, or 3, in which said filterbank is incorporated in a digital hearing aid.

23. A filterbank as claimed in claim 1, wherein the selection input enables the number of frequency band signals to be selected.

24. A filterbank as claimed in claim 23, wherein the selection input further enables the bandwidth of said frequency bands to be selected.

25. An oversampled filterbank, for filtering an information signal, the filterbank having a filterbank structure comprising:
   (a) a first analysis filterbank means for separating said signal into a plurality of N separate frequency bands, wherein the first analysis filterbank means includes transform means for transforming the audio signal into the frequency domain, with the N separate frequency band signals being present in the frequency domain;
   (b) processing means for receiving and processing each of said separate frequency band signals to provide N separate processed frequency band signals, wherein said processing means includes a multiplier means for multiplying each of the frequency band signals by an adjustable gain to provide the N separate processed frequency band signals;
   (c) a second synthesis filterbank means for receiving and recombining the N separate processed frequency band signals into a single output signal, the processing means being coupled between the first analysis filterbank means and the second synthesis filterbank means, wherein the second synthesis filterbank means includes inverse transform means for transforming the N separate frequency band signals into the single output signal in the time domain;
   (d) a selection input connected to both of the first analysis filterbank means and the second synthesis filterbank means, to enable the number of bands and the bandwidth of each frequency band to be selected, wherein the selection input further enables at least one of the following to be selected:
      (i) the number of frequency band signals;
      (ii) the bandwidth of said frequency bands;
      (iii) selection of stacking of said frequency bands in one of an even and an odd manner;
      (iv) the degree of overlap between said frequency bands;
      (v) an oversampling factor by which said frequency band is sampled above the theoretical minimum of critical sampling wherein the filterbank comprises an application specific integrated circuit, said application specific integrated circuit including the first analysis and the second synthesis filterbanks, and a programmable digital signal processor for controlling the number of frequency bands and the bandwidth of each frequency band, said digital signal processor being provided with the selection input.

26. A filterbank as claimed in claim 25, which is adapted to receive a single real monaural information signal, wherein said transform means generates non-negative frequency band signals and negative frequency band signals, said negative frequency band signals being derivable from the non-negative frequency band signals, and said processing means processes only said non-negative frequency band signals.

27. A filterbank as claimed in claim 25, wherein the filterbank is adapted to filter an audio signal comprising first and second real monaural information signals which are combined into a complex stereo signal and wherein said transform means generates N combined frequency band signals, and wherein said processing means includes:
   (a) channel separation means for separating the N combined frequency band signals into the N frequency band signals corresponding to said first information signal and the N frequency band signals corresponding to said second information signal, each of said N frequency band signals comprising non-negative and negative frequency band signals;
   (b) first independent channel processing means connected to the channel separation means for receiving and processing each of said separate frequency band signals of said first information signal to provide a first set of N separate processed frequency band signals;
   (c) second independent channel processing means connected to channel separation means for receiving and processing each of said separate frequency band signals of said second information signal to provide a second set of N separate processed frequency band signals; and
   (d) channel combination means connected to the first and second independent channel processing means for combining said first set of N processed separate frequency band signals and said second set of N processed separate frequency band signals.

28. A filterbank as claimed in claim 27, wherein said first and second independent channel processing means each process only the non-negative frequency band signals of the corresponding information signal, the negative frequency band signals being derivable from the non-negative frequency band signals.

29. A method of processing an information signal to selectively modify different frequency bands, the method comprising the steps of:
   (1) defining a filter frequency bandwidth to be analyzed;
   (2) dividing the filter frequency bandwidth into a plurality of uniformly spaced bands and defining characteristics of the filter bands, and selecting stacking of said frequency bands into one of an even and an odd manner and the degree of overlap between said frequency bands;
   (3) filtering the information signal to separate the signal into a plurality of frequency band signals, each representing one of said uniform filter bands, including oversampling the frequency band signals by a fraction above a theoretical initial sampling, thereby determining a decimation factor;
   (4) processing the frequency band signals; and
   (5) recombining the signals of the individual bands to form an output signal;
wherein the method includes as an additional step (6), at least one of:

(i) selecting the number of frequency band signals,
(ii) selecting the bandwidth of said frequency bands,
(iii) selecting stacking of said frequency bands in one of an even and an odd manner,
(iv) selecting the degree of overlap of said frequency bands, and
(v) selecting the oversampling a decimation factor by which said frequency band signals are sampled above critical sampling.

30. A method as claimed in claim 29, which includes selecting the degree of overlap of said frequency bands and providing for the selection of abutting and spaced apart frequency bands.

31. A method as claimed in claim 29, wherein the input in step (6) enables whether said frequency bands abut, overlap, or are spaced apart from one another to be selected.

32. A method as claimed in claim 29, wherein the input in step (6) enables the decimation factor to be selected.

33. A method as claimed in claim 29, wherein the input in step (6) enables whether said frequency bands are stacked in an even or odd manner to be selected.

34. A method as claimed in claim 29, wherein step (4) comprises setting a gain for each frequency band and multiplying each frequency band signal by the respective set gain.

35. A method as claimed in claim 29 which comprises applying the method to an audio information signal in a digital hearing aid.

36. A method as claimed in claim 35, including enhancing low-frequency bands by additional processing.

37. A method as claimed in claim 36, which includes subdividing at least one low-frequency band into smaller bands for individual processing.

38. A method as claimed in claim 35, which comprises selecting the number of bands and the width of the bands, in dependence upon acceptable delays and desired resolution.

39. A method as claimed in claim 29, wherein the input in step (6) enables the number of frequency band signals to be selected.

40. A method as claimed in claim 39, wherein the input in step (6) further enables the bandwidth of said frequency bands to be selected.

41. A method as claimed in claim 29, the method further comprising:
(a) in step (3) separating said information signal into N separate frequency band signals;
(b) in step (4) processing each of said separate frequency band signals to provide N separate processed frequency band signals;
(c) in step (5), recombining the N separate processed frequency band signals to form the output signal; and
(d) selecting either the number of frequency bands or whether said frequency bands are stacked in an even or odd manner.

42. A method as claimed in claim 41, which includes transforming the information signal into the frequency domain, providing N separate frequency band signals in the frequency domain, and effecting an inverse transform of the N separate processed frequency band signals into the output signal in the time domain.

43. A method as claimed in claim 42, which comprises generating non-negative frequency band signals and negative frequency band signals, the negative frequency band signals being derivable from the non-negative frequency band signals, and, in step (4), processing only said non-negative frequency band signals.

44. A method as claimed in claim 43, which comprises:
(a) receiving an information signal comprising first and second real monaural information signals combined into a complex stereo signal and, when transforming the information signal into the frequency domain, generating N combined frequency band signals;
(b) separating the N combined frequency band signals into the N frequency band signals corresponding to said first information signal and the frequency band signals corresponding to said second information signal, each of said N frequency band signals comprising non-negative and negative frequency band signals;
(c) processing each of said separate frequency band signals of said first information signal to provide a first set of N separate processed frequency band signals;
(d) processing each of said separate frequency band signals of said second information signal to provide a second set of N separate processed frequency band signals; and
(e) combining said first set of N processed separate frequency band signals and said second set of N processed separate frequency band signals.

45. A method as claimed in claim 44, which comprises, for each of said first and second information signals processing only the non-negative frequency band signals of the corresponding information signal.

46. A method as claimed in claim 42, wherein the method is effected by digital signal processing, the method including:
passing an original analog signal through an analog-to-digital conversion means to convert the analog signal into an input digital sample stream at an initial input sampling rate which forms said information signal, and wherein the output signal after the inverse transform comprises an output digital data stream; and
effecting a digital to analog conversion of the output digital data stream to form an analog version of the output signal.

47. A method as claimed in claim 46, wherein the step of transforming the information signal into the frequency domain comprises:
(a) blocking the input digital sample stream into blocks of R samples, where $R \leq N$, to provide a blocked input digital sample stream, the ratio of N/R corresponding to an oversampling factor;
(b) applying an analysis window function to the input digital sample stream to provide a windowed blocked digital sample stream, said analysis window function being defined by a set of analysis window coefficients;
(c) overlapping and adding blocks of said windowed blocked digital sample stream, each of said blocks comprising N digital samples, to provide a summed block of N digital samples; and
(d) transforming the signal into a discrete frequency domain signal having N components, the N components corresponding to the N frequency band signals.

48. A method as claimed in claim 47, wherein the step of effecting an inverse transform of the N separate processed frequency band signals comprises:
(a) effecting an inverse transform to form a block of N digital samples;
(b) replicating and concatenating said processed block of N digital samples to provide a periodically extended block of N digital samples;
(c) applying a synthesis window function to said extended block of N digital samples to provide a windowed periodically extended block of N digital samples, said synthesis window function being defined by a set of synthesis window coefficients;

(d) adding said windowed periodically extended block of N samples to a summation buffer; and (e) each time a new windowed periodically extended sample is received, shifting the contents of the summation buffer by R samples from one end of the summation buffer towards the other end of the buffer, providing zeros to fill the R empty samples at the one end of the buffer, and passing the R samples displaced out of the other end of the buffer to an output to provide a processed information signal.

49. A method as claimed in claim 48 wherein the analysis window coefficients and the synthesis window coefficients can be varied.

50. A method as claimed in claim 48, which includes forming the synthesis window function by decimating the analysis window function.

51. A method as claimed in claims 42, 46 or 48, which includes selecting stacking of the frequency bands in one of even stacking and odd stacking, within the frequency bandwidth.

52. A method as claimed in claim 47 or 48 wherein the oversampling factor can be varied and is at least equal to 2.

* * * * *

UNITED STATES PATENT AND TRADEMARK OFFICE
CERTIFICATE OF CORRECTION

PATENT NO.    : 6,236,731 B1
DATED         : May 22, 2001
INVENTOR(S)   : Schneider et al.

It is certified that error appears in the above-identified patent and that said Letters Patent is hereby corrected as shown below:

Column 17,
Line 30, change "audio" to -- information --.

Column 18,
Line 60, change "initial" to -- minimum of critical --.

Column 19,
Line 7, after "selecting the" delete "oversampling a".

Signed and Sealed this

Fifth Day of August, 2003

JAMES E. ROGAN
*Director of the United States Patent and Trademark Office*

UNITED STATES PATENT AND TRADEMARK OFFICE
CERTIFICATE OF CORRECTION

PATENT NO. : 6,236,731 B1
DATED : May 22, 2001
INVENTOR(S) : Schneider et al.

It is certified that error appears in the above-identified patent and that said Letters Patent is hereby corrected as shown below:

<u>Title page,</u>
Item [75], Inventors should be listed as follows:

-- Anthony Todd Schnieder, Waterloo; Robert Brennan, Kitchener, both of (CA). --

Signed and Sealed this

Twenty-sixth Day of August, 2003

JAMES E. ROGAN
*Director of the United States Patent and Trademark Office*

UNITED STATES PATENT AND TRADEMARK OFFICE
CERTIFICATE OF CORRECTION

PATENT NO.     : 6,236,731 B1
DATED          : May 22, 2001
INVENTOR(S)    : Schneider et al.

It is certified that error appears in the above-identified patent and that said Letters Patent is hereby corrected as shown below:

<u>Title page,</u>
Item [75], Inventors should be listed as follows:

-- Anthony Todd Schneider, Waterloo; Robert Brennan, Kitchener, both of (CA). --

Signed and Sealed this

Ninth Day of December, 2003

JAMES E. ROGAN
*Director of the United States Patent and Trademark Office*